United States Patent [19]

Genesi

[11] 4,216,379
[45] Aug. 5, 1980

[54] LOW VOLTAGE BIAS CIRCUIT FOR A PHOTO-DIODE

[75] Inventor: Robert C. Genesi, Sterling, Mass.

[73] Assignee: Sprague Electric Company, North Adams, Mass.

[21] Appl. No.: 955,086

[22] Filed: Oct. 26, 1978

[51] Int. Cl.$^2$ .............................................. H01J 39/12
[52] U.S. Cl. .................................... 250/214 P; 354/51
[58] Field of Search ........ 250/214 R, 214 RC, 214 A, 250/214 P; 307/311; 354/48, 50, 51

[56] References Cited

U.S. PATENT DOCUMENTS

| | | | |
|---|---|---|---|
| 3,424,908 | 1/1969 | Sitter | 307/311 |
| 3,486,821 | 12/1969 | Westhaver | 250/214 P |
| 3,808,463 | 4/1974 | Yata et al. | 354/32 |
| 4,085,411 | 4/1978 | Genesi | 354/51 |

Primary Examiner—David C. Nelms
Attorney, Agent, or Firm—Connolly and Hutz

[57] ABSTRACT

A low-voltage bias circuit for a photo-diode includes first and second bipolar transistors with a common base connection and grounded emitters, the photo-diode being connected between the emitter of the first transistor and ground in the reverse polarity direction. A current-mirror circuit uses as the reference current the collector current from the first transistor, which is essentially the photo-current, and produces a feed-back current through the base-emitter junction of the second transistor to hold the voltage across the photo-diode at a near zero value for a wide range in values of photo-current. Thus there is minimum delay in the response of the photo-current to step-functions of the incident light.

10 Claims, 3 Drawing Figures

LOW VOLTAGE BIAS CIRCUIT FOR A PHOTO-DIODE

BACKGROUND OF THE INVENTION

This invention relates to a low voltage bias circuit for a photo-diode.

It is well known that a p-n junction biased with a reverse voltage behaves like a current source, generating a current that is proportional to light incident upon the junction. One circuit configuration that is particularly well suited for supplying a reverse bias and at the same time producing either an output current or an output voltage which, without any substantial offset, is proportional to the photocurrent, consists of a bipolar transistor, the photodiode being connected from the transistor emitter to a ground buss, a voltage bias being provided to the transistor base with respect to the ground buss in a polarity to forward bias the base-emitter junction and a signal sensing means at the collector of the transistor. The collector current substantially equals the photo-current with no off-set.

This conventional bias circuit, however, has the disadvantage that for situations wherein the incident light may change rapidly, there is an accompanying change in the base-emitter voltage drop and also sometimes in the non-ideal base bias voltage, which leads to a change in the magnitude of the reverse bias voltage applied across the photo-diode. Since all p-n junctions have an inherent junction capacity, such photo-diode voltage changes lead to a delay in the photo-diode current in response to a step-function of incident light.

It is therefore an object of this invention to provide a low-voltage bias circuit for a photodiode to maximize the photo-current response time to rapid changes in light intensity.

It is a further object of this invention to provide a feed-back regulated voltage across the photo-diode.

SUMMARY OF THE INVENTION

A low voltage bias circuit for a photo-diode has a first bipolar transistor and a bipolar input device which typically consists of a bipolar transistor with the collector and base shorted together. The photo-diode is connected between the emitter of the first transistor and one of two d.c. power supply busses. The p-n junction is connected between the base of the first transistor and the one buss, the polarity of connection of the base-emitter junction being opposite to that of the p-n junction and the photo-diode in the circuit loop containing all three in series. The reference-current input of a current-mirror circuit means is connected to the collector of the first transistor and the output current of the current-mirror circuit means is fed back in the forward direction to the p-n junction, the feed back current being proportional to the input current and thus to the photodiode current. By this means, the voltage across the photo-diode is maintained at a near zero value for a wide range of photo-current values.

DESCRIPTION OF THE PREFERRED EMBODIMENTS

Figure 1:
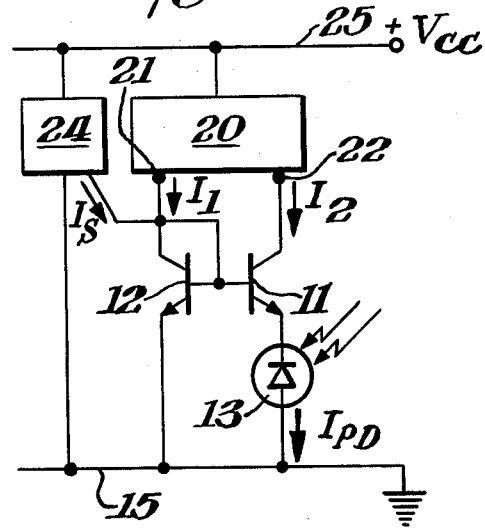
FIG. 1 shows an elemental photo-diode bias circuit of this invention.

In FIG. 1, two NPN silicon transistors 11 and 12 have their bases connected together and their emitters connected to a d.c. (ground) buss 15 in a manner that is typical of a standard current-mirror circuit except that a photo-diode 13 is in the emitter to buss connection of transistor 11. With reference to the text book, Analogue Integrated Circuit Design by A. B. Grebene; Litton Educational Publishing, Inc., 1972, pages 118–119, it is seen that the voltage across the photo-diode $V_{PD}$ can be expressed as $$V_{PD} = V_T \ln(I_1/I_2)$$

The constant, $V_T$, is 0.026 volts for PN junctions in silicon at room temperature.

The above equations are for the sepcial case where the base-emitter junctions $A_{11}$ and $A_{12}$, of transistors 11 and 12, respectively, are equal. More generally the expression for the photo-diode voltage is $$V_{PD} = V_T \ln(I_1 A_{11}/I_2 A_{12})$$

This invention recognizes the principle that in a circuit such as that of FIG. 1, the voltage across the photo-diode is essentially a logarithmic function of the ratio of currents in the collectors of the two transistors.

By differentiating both sides of the voltage equation, whereby $$\frac{dV_{PD}}{V_T} = \frac{d(I_1/I_2)}{(I_1/I_2)},$$

it is seen that changes in the current ratio will result in corresponding (percentage-wise) changes in the photo-diode voltage relative to the small voltage $V_T$ (0.026 volts). Thus a $+100\%$ change in $I_1/I_2$ causes a $+0.026$ volt change in the photo-diode voltage.

For the special case where the current densities in the base-emitter junctions are equal, the photo-diode voltage is seen to be zero. It can be further computed from these equations that for current density ratios ranging from $+10$ to $-10$ that the photo-diode voltage $V_{PD}$ remains within the narrow range of $+0.06$ to $-0.06$ volts.

The circuit block 20 in FIG. 1 represents a current-mirror circuit having a reference or input terminal 22 and an output current terminal 21. Such circuits provide an output current (e.g. $I_1$) having a fixed ratio to the reference current (e.g. $I_2$). Typically the common base current gain $\alpha$ is very nearly unity so that $I_2$ is for practical purposes equal to the photo-diode current $I_{PD}$, and $I_1$ remains proportional to $I_{PD}$ for many orders of magnitude of light intensities impinging on the photo-diode.

There is also shown in FIG. 1, a circuit block 25 for supplying a start current $I_S$ to the collector (and base) of transistor 12. The current $I_S$ puts the transistors 11 and 12 in the conducting mode, and thus operational in the manner described above for providing a low-voltage bias to the photo-diode. The current $I_S$ may flow continuously, in which case in the above noted equations the term $I_1$ must be replaced by $I_S + I_1$. In this event the ratio $(I_S + I_1)/I_2$ will only be substantially constant when $I_1$ (or $I_{PD}$) becomes an order of magnitude greater than $I_S$.

Alternatively, the start current $I_S$ may be merely an impulse of current after which the circuit will remain in the operating mode as long as light is incident upon the photo-diode.

Figure 2:
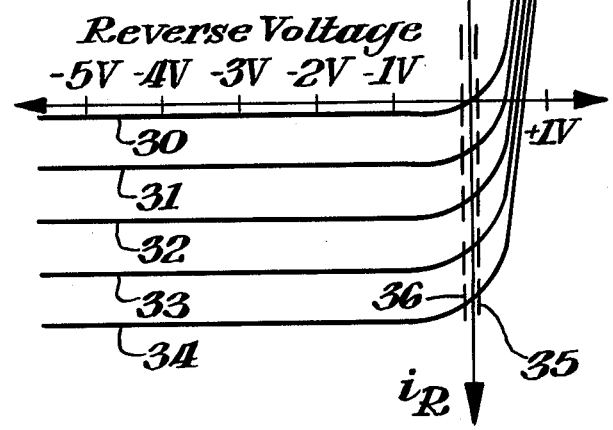
FIG. 2 shows a graph of the reverse current versus the reverse voltage of a photo-diode for various light intensities impinging thereon.

Line 30 in the graph of FIG. 2 is the silicon photo-diode current as a function of voltage for no light impinging on the diode. Lines 31, 32, 33, and 34 are for increasing light intensities L, 2L, 3L and 4L, respectively. Without a constant start current $I_S$, the photo-diode voltage remains within lines 35 and 36 ($\pm 0.06$ volts) for current density ratios in the range $\pm 10$, as explained above. When a constant start current is employed, its magnitude may exceed the value of $I_1$ corresponding to the highest light intensity of interest and still not increase the photo-diode voltage beyond about 0.5 volts, although the voltage ($V_{PD}$) stabilizing current $I_1$ from current-mirrow circuit 20 is then less effective.

Figure 3:
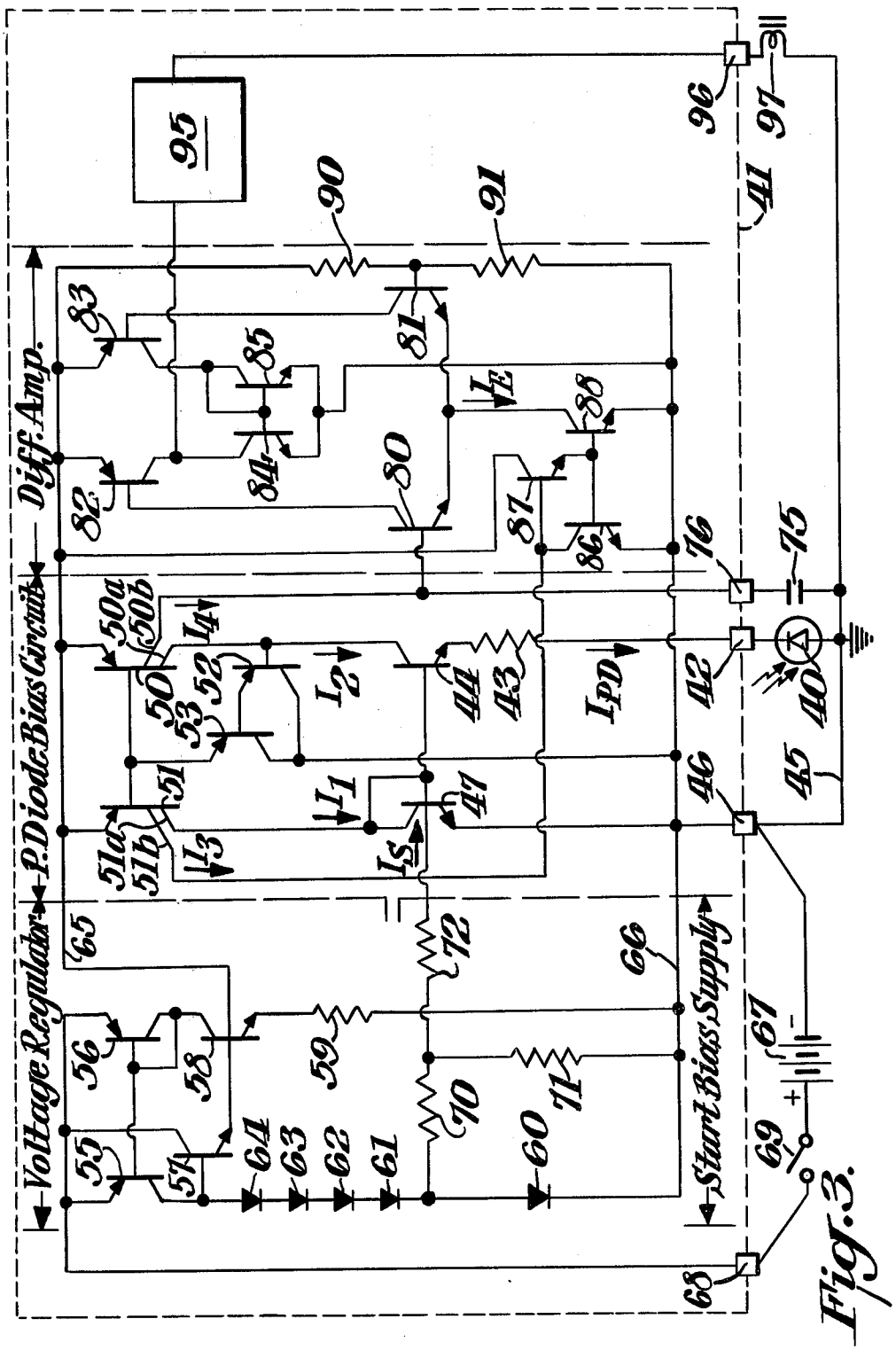
FIG. 3 shows a portion of a camera shutter control circuit including a bias circuit of this invention.

The characteristic curves of FIG. 2 represent the silicon junction photo-diode 40 shown connected in the circuit of FIG. 3. This photo-diode has an active junction area of $73 \times 90$ mils ($10^{-3}$ inches) or about 0.04 cm$^2$. The junction capacity with no voltage applied is about 300 pF. A type BG-18 light filter is used over the photo-diode and the sensitivity with the filter is 35 nano-amps/foot-candle.

With reference to FIG. 3, the circuit portions shown encircled by dashed line 41 are formed in the N-type epitaxial layer having been grown over a P-type crystalline silicon wafer by standard integrated circuit techniques. The discrete photo-diode 40 has its cathode connected to integrated circuit terminal pad 42 and thence through a resistor 43 to the emitter of an NPN transistor 44. The anode end of photo-diode 40 is connected to a ground conductor 45 which in turn is connected to terminal pad 46 and thence to the emitter of transistor 47. Transistors 44 and 47 serve the same functions as transistors 11 and 12 of FIG. 1.

The planar PNP transistors 50, 51, 52 and 53 in FIG. 3 are interconnected in a standard current-mirror circuit configuration and serve the same function as the current-mirror circuit 20 of FIG. 1. Other current-mirror circuits that may be appropriately used in this invention are described in my U.S. Pat. No. 4,085,411, issued Apr. 18, 1978. Transistors 55, 56, 57 and 58 are connected with resistor 59 (10,000 ohms) and the series string of diodes 60, 61, 62, 63 and 64 to regulate the voltage regulator circuit.

A start-bias supply circuit connects the forward biased diode 60 to resistors 70, 71 and 72 (5K, 15K and 20 Kohms, respectively) to provide a start current $I_S$ to the photo-diode bias circuit transistors 47 and 44 in a similar manner with which the above described circuit block 24 provides start current $I_S$ to transistors 12 and 11 in the circuit of FIG. 1.

Collector 50a of transistor 50 may be considered the input terminal to the current-mirror circuit through which the reference current $I_4$ flows while collector 51a may be considered the output terminal of the current-mirror circuit supplying the feedback current $I_1$ to transistor (diode) 47. A second collector 50b of transistor 50 has a collector-base junction area about 10 times that of collector 50a. A capacitor 75 (0.005 μF) is connected from the ground conductor 45 to terminal pad 76 and thence to the collector 50b. The current $I_4$ has a magnitude 10 times that of the current $I_2$ (or $I_{PD}$) charging the integrating capacitor 75. The collector 50b is also connected to the input of a switching differential amplifier being comprised of transistors 80, 81, 82, 83, 84 and 85, and having an active emitter current-source consisting of transistors 86, 87 and 88. A voltage divider network consists of resistors 90 (7 Kohms) and 91 (20 Kohms) and provides a voltage reference to the base of transistor 81 of about 2.07 volts so that transistor 82 conducts only after the voltage across the capacitor has reached 2.07 volts. A power amplifier 95 has its input connected to the output of the differential amplifier at the collector of transistor 82.

The components shown in FIG. 3 are mounted in a camera (not shown) with the photo-diode 40 placed behind the shutter so as to be exposed to light simultaneously with the photographic film. The shutter is opened mechanically by the operator. When the voltage across the integrating capacitor reaches the voltage necessary to "switch" the differential amplifier, e.g. turns on transistor 82, the power amplifier 95 transmits an electrical signal through pad 96 to shutter-closing solenoid 97 to terminate exposure of the film to light.

At 5 foot candles light intensity, this circuit provides a shutter-open time of about 6 milliseconds. At this light level the current $I_4$ is about 1.7 microamps so that transistor 80 will not turn on after the capacitor voltage reaches the threshold voltage, 2.07 volts, unless the emitter-current source consisting of transistors 86, 87 and 88 is providing a current $I_3$ from the collector of transistor 88 of a magnitude less than the value of $I_4$. For lower light levels, even a lower current $I_E$ is required for the circuit to remain operable.

On the other hand, at high light levels, e.g. above about 50 foot candles, the delay becomes significant in the differential amplifier between the time the capacitor reaches the threshold voltage and the time at which the transistor 82 turns on to effect closure of the shutter. This delay may be reduced by providing a relatively high value of emitter current $I_E$.

A current $I_E$ having a large value at high light levels and a low value at low light levels is accordingly provided. Transistor 51 has another collector 51b having the same collector-base junction area as that of collector 51a. The base-emitter junction areas of transistors 50 and 51 are the same, so current $I_3$ has the same amplitude as current $I_1$ and is about 5 times the amplitude of the photo-current $I_{PD}$. The current $I_3$, being proportional to the photo-current $I_{PD}$, is fed to the reference transistor 86 in the current source of the differential amplifier so that the emitter current $I_E$ is proportional to the light intensity sensed by the photo-diode. The switching differential amplifier is thereby rendered operable and is triggered-on in a linear manner over about six orders of magnitude of current $I_4$ (or current $I_{PD}$).

Resistor 43 (30 Kohms) is added in series with the photo-diode 40 to limit transient charging of the junction capacity of photo-diode 40 when closing the battery switch 69. At the highest light level of interest, namely at about 200 foot candles at which the magnitude of the photo-diode current is 7 microamps, the voltage drop across resistor 43 is about 0.2 volts and the feed-back current $I_1$ is about 38 microamps. The start current $I_S$ is about 5 microamps, and the voltage from the emitter of transistor 44 to ground is about 0.16 volts maintaining a small but forward voltage across the photo-diode 40 of around 0.04 volts. Thus at high light levels the feed-back current $I_3$ dominates the start current $I_S$, the voltage stabilizing feed-back system is operative and the effect of the presence of the resistor 43 on the photo-diode voltage is small.

Thus when the shutter is opened and the light level is high, the photo-diode generates a high step of photo-current. The shutter open-time at high light levels is short. Since the voltage across the photo-diode is maintained at near zero, no substantial portion of the photo-current is diverted to charge the inherent photo-diode junction capacity which may otherwise substantially lengthen the shutter open-time at high light levels.

What is claimed is:

1. A low voltage bias circuit for a photo-diode comprising two d.c. power supply busses; a first bipolar transistor; a bipolar input device having at least one p-n junction, said photo-diode being connected between the emitter of said first transistor and one of said busses, said p-n junction being connected between the base of said first transistor and said one buss, the polarity of connection of the base-emitter junction of said first transistor being opposite to that of said p-n junction and of said photo-diode in the circuit loop containing all three in series whereby the photo-current generated by said photo-diode in response to light impinging thereon flows in the collector of said first transistor when said first transistor is on; and a current mirror circuit means being connected to the other of said busses and having an input connected to said collector of said first transistor for producing a feed-back current in the forward direction through said p-n junction that is substantially proportional to said photo-current.

2. The bias circuit of claim 1 wherein said current-mirror means is comprised of a second and a third bipolar transistor of polarity type opposite to that of said first transistor, said second and third transistors having their bases connected to each other and their emitters connected to said other buss, one collector of said second transistor being said current-mirror input and one collector of said second transistor being connected to said p-n junction.

3. The bias circuit of claim 1 additionally comprising a current amplifying means that is connected to the collector of said first transistor for amplifying the current flowing in said first transistor collector and providing an amplified output current which is substantially proportional to said photo-current.

4. The bias circuit of claim 3 additionally comprising an integrating capacitor being connected to the output of said current amplifying means.

5. The bias circuit of claim 1 additionally comprising a control current generator means that is connected to the collector of said first transistor for generating a control current which is substantially proportional to said photo-current.

6. The bias circuit of claims 3, 4 or 5 additionally comprising a differential amplifying means for amplifying the voltage across said integrating capacitor, said differential amplifying means having a pair of amplifying transistors whose emitters have a common connection; and a variable current source means the output of which is connected to said emitters of said amplifying transistors and the input of which is connected to said generating means for producing at said commonly connected emitters an emitter current which is substantially proportional to said photo-current.

7. The bias circuit of claim 1 wherein the junction area of said p-n junction is substantially equal to the base-emitter junction area of said first transistor.

8. The bias circuit of claim 1 wherein said bipolar input device is an input bipolar transistor, said p-n junction thereof being the base-emitter junction, the collector and base of said input transistor being connected together.

9. The bias circuit of claim 1 additionally comprising a bias-starting means for turning on said first transistor after applying a d.c. supply voltage between said two busses.

10. The bias circuit of claim 1 wherein the product of said feed-back current and the area of said p-n junction is about 5 times the product of said photo-current and the area of said base-emitter junction of said first transistor.

* * * * *